United States Patent [19]
Rogers

[11] Patent Number: 5,149,991
[45] Date of Patent: Sep. 22, 1992

[54] GROUND BOUNCE BLOCKING OUTPUT BUFFER CIRCUIT

[75] Inventor: Alan C. Rogers, Palo Alto, Calif.

[73] Assignee: National Semiconductor Corporation, Santa Clara, Calif.

[21] Appl. No.: 711,313

[22] Filed: Jun. 6, 1991

[51] Int. Cl.[5] .................. H03K 17/16; H03K 19/20
[52] U.S. Cl. ................................ 307/443; 307/451; 307/594
[58] Field of Search ............... 307/443, 475, 451, 603, 307/605, 592, 594

[56] References Cited

U.S. PATENT DOCUMENTS

| | | | |
|---|---|---|---|
| 4,864,164 | 9/1989 | Ohshima et al. | 307/443 |
| 4,883,978 | 11/1989 | Ohshima et al. | 307/443 |
| 4,942,398 | 7/1990 | Peterson | 307/443 |
| 4,975,600 | 12/1990 | Tran et al. | 307/443 |
| 5,015,889 | 5/1991 | Reay | 307/475 |
| 5,049,763 | 9/1991 | Rogers | 307/475 |

*Primary Examiner*—David Hudspeth
*Assistant Examiner*—Andrew Sanders
*Attorney, Agent, or Firm*—Daniel H. Kane; James W. Rose; Lee Patch

[57] ABSTRACT

An output buffer circuit incorporates a ground bounce blocking circuit which blocks transfer of ground bounce pulses from the output ground lead (GND,PGND) to the output ($V_{OUT}$) for protecting quiet outputs tied to a common ground bus. A diode element (SD1,D1,ND1, NSC) is coupled in the sinking current path in series with the primary pulldown transistor element (N1,N1P) between the buffer circuit output ($V_{OUT}$) and the ground rail (GND,PGND). The diode element is oriented for passing sinking current to the low potential ground rail and for blocking transfer of ground bounce pulses originating in the ground rail (GND,PGND) to the output. The ground rail may be bifurcated to provide a relatively noisy output ground lead (PGND) and a relatively quiet ground lead (QGND). The primary pulldown transistor element (N1P) is coupled to the relatively noisy output ground lead (PGND). A secondary pulldown transistor element (N1S) is also provided with the control nodes of the primary and secondary pulldown transistor elements (N1P),N1S) coupled to each other. The secondary pulldown transistor element (N1S) is coupled between the output ($V_{OUT}$) and relatively quiet ground lead (QGND) and discharges a secondary sinking current for pulling down and maintaining the potential at the output ($V_{OUT}$) substantially at ground zero potential. Other ground bounce blocking circuit configurations are described for MOS, bipolar and BICMOS output buffer circuits.

14 Claims, 4 Drawing Sheets

GROUND BOUNCE BLOCKING OUTPUT BUFFER CIRCUIT

TECHNICAL FIELD

This invention relates to a new output buffer circuit useful for applications in which multiple output buffer circuits are coupled to a common ground bus. The output buffer circuit incorporates a ground bounce blocking circuit which blocks transfer of ground bounce pulses from the output buffer ground lead to quiet outputs which share the same ground bus. The invention is applicable, for example in multiple buffer circuit line drivers for protecting quiet buffer circuit outputs.

BACKGROUND ART

A conventional prior art MOS transistor output buffer circuit 10 is illustrated in FIG. 1. Multiple output buffers of this type may be incorporated, for example, in an octal buffer line driver. The pulldown transistor element is provided by the relatively large current carrying capacity NMOS transistor element N1. The pullup transistor element is provided by relatively large current carrying capacity PMOS transistor element P1. Output buffer circuit 10 in the example of FIG. 1 is a non-inverting tristate output device, and data signals propagate from the input $V_{IN}$ to the output $V_{OUT}$ in the bistate operating mode. The tristate output enable and disable signals are applied at the $\overline{OE}$ terminal input.

A data signal at the input $V_{IN}$ passes through two inverting current amplification stages 12,14 and then is applied at the same polarity as the input to NAND gate 15 and NOR gate 16. NAND gate 15 drives pullup transistor element P1. NOR gate 16 drives the pulldown transistor element N1. The second input to each of the gates 15,16 is derived from the $\overline{OE}$ terminal input.

An output enable signal OE is applied in inverted polarity $\overline{OE}$ at the tristate $\overline{OE}$ terminal. This tristate signal passes through first and second inverting current amplification stages 18,20 and is applied at the same polarity as the $\overline{OE}$ signal to the input of NOR gate 16. The tristate signal also passes through first and second inverting stages of current amplification 18,20 and a third inverter stage 22 before it is applied to the input of NAND gate 15. The tristate signal applied to the input of NAND gate 15 is thus of opposite polarity from the $\overline{OE}$ signal and is in phase with output enable signal OE.

The logic gate arrangement of the output buffer circuit 10 of FIG. 1 delivers output data signals of logic high and low potential levels at the output $V_{OUT}$ in phase with data signals at the input $V_{IN}$ during bistate operation when the output enable signal OE is high ($\overline{OE}$ low). When the OE signal is low ($\overline{OE}$ high) during the high impedance third state, both the pullup transistor element P1 and the pulldown transistor element N1 are disabled. The output $V_{OUT}$ appears as a high impedance to other output buffers on a common bus.

A prior art TTL output device 20 is illustrated in FIG. 2. A pullup transistor element, Darlington amplifier transistor pair Q4,Q4A, sources a relatively large current from the high potential TTL power supply rail $V_{CC}$ through collector resistor R4 to an output node $V_{OUT}$. A relatively large pulldown transistor element Q3 sinks current from the output node $V_{OUT}$ to the ground or low potential power rail, GND. The phase splitter transistor element Q2 controls the conducting states of the pullup transistor element Darlington pair Q4,Q4A and the pulldown transistor element Q3 in opposite phase in response to logic high and low potential level data signals at the input node $V_{IN}$.

The base of phase splitter transistor element Q2 is coupled to the input node $V_{IN}$ through the input transistor element Q1 which delivers base drive current to phase splitter transistor Q1 from the TTL power supply $V_{CC}$ through resistor R1 when the input signal at input node $V_{IN}$ is at the logic high potential level. When a logic low level signal appears at the input node $V_{IN}$ the phase splitter transistor Q2 is deprived of base drive current. The TTL output gate 20 in the example of FIG. 2 is therefore inverting. A logic high level potential signal at input node $V_{IN}$ produces a logic low level potential signal at output node $V_o$ and vice versa.

With a high level potential signal at $V_{IN}$, phase splitter Q2 conducts current from TTL power supply $V_{CC}$ through resistor R2. Current is diverted from the base of the Darlington transistor Q4A. Phase splitter transistor Q2 drives the base of the pulldown transistor element Q3. Diode SD2 helps discharge the base of Darlington transistor Q4 during the transition from high to low at the output. With a low level potential signal at $V_{IN}$ phase splitter transistor Q2 is not conducting, the pulldown transistor element Q3 is deprived of base drive, and current from TTL power supply $V_{CC}$ through resistor R2 drives the base of the pullup transistor element Q4A. Resistor R3 is the discharge path for the pulldown transistor Q3. A TTL output buffer line driver is typically also constructed as a tristate output device, for example, as described in U.S. Pat. Nos. 4,287,433; 4,255,670; 4,311,927; 4,581,550; 4,661,727; and 4,649,297.

In both MOS and bipolar technology output buffer line drivers, a relatively large current carrying capacity primary pulldown transistor element is coupled at the output for sinking a relatively large discharge current from the output to ground. A relatively large current carrying capacity primary pullup transistor element is coupled at the output for sourcing a relatively large charging current to the output from a power supply. The pulldown transistor element turns on for discharging the output load capacitance and for sinking current from the output to the ground rail GND to effect the transition from logic high to low potential at the output $V_{OUT}$. The surge or acceleration of charge develops a voltage across the output ground lead parasitic inductance LG proportional to L di/dt resulting in a positive ground rise in potential or ground bounce in what should be a static low potential power rail. This ground bounce may typically be in the order of 0.5 to 2.5 volts above the external ground 0 volts for circuits with a power source $V_{CC}$ operating at 5 volts.

The disruptive effects of this noise on the output ground and supply leads include pulsing of noise on input and internal circuit ground and power supply lines; threshold shifts in the reference voltages for high and low potential level data signals causing false data signals; and of particular concern to the present invention, interference with other low or quiet output buffer circuits on a common bus by transfer of ground bounce noise spikes from the ground rail to the output. The disruption of quiet buffer circuit outputs on a common ground bus is a particular problem of MOS output buffer circuits because the NMOS pulldown transistor element N1 provides a highly conductive path from ground rail GND to output $V_{OUT}$. For example, a logic low condition output buffer of an octal buffer line driver may receive a voltage rise ground bounce pulse causing a false high data signal. These problems associated with output ground and supply noise are of increased concern in recent integrated circuits that switch higher currents at higher speeds.

While transfer of ground bounce noise spikes from the ground rail GND to the output $V_{OUT}$ is a particular problem of MOS output buffer circuits, it also occurs in bipolar output devices. The NPN bipolar transistor structure is often accompanied by a parasitic diode coupling between the grounded substrate and the buried collector layer and collector region, providing a conductive path for transfer of ground bounce noise spikes from the ground rail GND to the output $V_{OUT}$. Furthermore, base drive current is diverted to the low output during such ground bounce events. Another disadvantage of the bipolar output device is the requirement for quiescent current $I_{CC}$ for continued functioning of the device even in the logic low potential level output condition.

A BICMOS output drive stage as illustrated in FIG. 3 alleviates some of the problems of the separate MOS or separate bipolar output buffer circuit. In the conventional BICMOS pulldown circuit shown in FIG. 3, the MOS pulldown transistor element NB controls a final bipolar output pulldown transistor element QB. The BICMOS combination eliminates the quiescent base drive current requirement to the bipolar output pulldown transistor element QB so there is no diversion of base drive current to the output $V_{OUT}$ during a ground bounce event. However, the NMOS transistor element NB and NPN transistor element QB still tend to have parasitic clamp diodes which pass reduced amplitude ground bounce pulses from the ground rail GND to the output $V_{OUT}$. Furthermore, the BICMOS circuit of FIG. 3 cannot pull down the output $V_{OUT}$ below $1V_{BE}$, e.g. approximately 0.6 v.-0.8 v.

The phrase "transistor element" is used herein to refer to integrated circuit transistors from different IC technologies including MOS transistors such as NMOS and PMOS transistor elements, and bipolar transistors including, for example, NPN and PNP transistor elements in TTL and ECL circuits. The transistor elements are generically characterized as having a primary current path with primary current path first and second terminal leads or electrodes, and a third control terminal lead or electrode for controlling the conducting state of the primary current path. In the case of an NMOS transistor element, for example, the primary current path first terminal lead is the drain lead, the second terminal lead is the source lead, and the third control terminal lead is the gate lead, etc. In the case of a bipolar NPN transistor element, the primary current path first terminal lead is the collector lead, the second terminal lead is the emitter lead, and the control terminal lead is the base lead, etc. In the case of PMOS and PNP transistor elements, the role of the first and second terminal leads are the inverse from that of the NMOS and NPN transistor elements respectively.

OBJECTS OF THE INVENTION

It is therefore an object of the present invention to provide a new ground bounce blocking circuit for output buffer circuits for blocking transfer or transmission of ground bounce pulses from the low potential power rail to the buffer circuit output. The invention is thereby intended to protect quiet buffer circuit outputs where output buffer circuits are coupled to a common ground bus.

Another object of the invention is to provide an output buffer circuit which eliminates transfer of ground bounce noise spikes from the low potential ground rail to the buffer circuit output while still permitting pulldown of the output substantially to ground zero potential for delivering a logic low potential level signal at the output.

A further object of the invention is to take advantage of split lead frames and integrated circuit devices with relatively isolated output ground lead and quiet ground lead for eliminating transfer of ground rise noise spikes to the output. The invention also provides a new bipolar transistor structure for isolating ground bounce pulses.

DISCLOSURE OF THE INVENTION

In order to accomplish these results the invention provides a diode element coupled in the sinking current path between the buffer circuit output and the primary pulldown transistor element. The diode element is oriented for passing sinking current to the low potential ground rail and for blocking transfer of ground bounce pulses in the ground rail to the output. An advantage of this ground bounce blocking circuit is that quiet buffer circuit outputs coupled to a common bus are protected from ground bounce noise spikes.

A variety of alternative diode elements may be incorporated in the ground bounce blocking output buffer circuit. For example the diode element may simply be a pn junction diode element. Preferably, however a Schottky diode is constructed with a relatively low forward threshold potential, for example as low as 0.2 v. This permits the ground bounce blocking output buffer circuit to pull the output to a lower potential level approaching ground potential in the logic low potential level output condition. Furthermore, a gate to drain shorted NMOS transistor element may be coupled as a diode in the current sinking path permitting pulldown of the output effectively to ground zero potential.

An advantage of the diode coupled NMOS transistor element is that the threshold voltage may be adjusted substantially to any desired level. For example, the threshold may be brought down by appropriate implants through the poly layer into the substrate from a typical value of one volt to zero or even slightly negative to permit pulldown of the output $V_{OUT}$ all the way to ground zero potential. A further advantage is that the diode coupled NMOS transistor element does not have to conform to the same gate/channel length as the other circuit transistors. The channel length can be reduced from a typical value of $2\mu$ to $1\mu$, reducing the resistance of the diode to substantially less than and even half that of the conventional circuit transistors. The NMOS transistor element coupled as a diode may be used to minimize both threshold and resistance.

In the preferred example embodiment, the output ground rail is bifurcated to separate a relatively noisy output ground lead and a relatively quiet ground lead using for example a split lead frame or separate ground leads relatively inductively isolated from each other. The primary pulldown transistor element is coupled to the relatively noisy output ground lead. The invention further provides a relatively small current carrying capacity secondary pulldown transistor element with control nodes of the primary and secondary pulldown transistor elements coupled to each other. The secondary pulldown transistor element is coupled between the output and the relatively quiet ground lead. An advantage of this circuit arrangement is that the secondary pulldown transistor element discharges a relatively small sinking current for pulling down the potential at the output substantially to ground potential in the steady state logic low potential level output condition. The small current carrying capacity effectively blocks return of ground bounce noise spikes.

A delay circuit may be interposed between the control nodes of the primary and secondary pulldown transistor elements to delay turn on of the secondary pulldown transistor element. The secondary pulldown transistor element therefore turns on only after the primary transistor element substantially discharges the output through the ground bounce blocking diode element. The secondary pulldown transistor element thereafter completes pulldown of the output substantially to the ground potential level and maintains the ground potential level at the output during the steady state condition. The current carrying capacity of the secondary pulldown transistor element may be selected in this example to be any value that achieves the desired steady state characteristics at the output.

According to an alternative embodiment of the invention, a pulldown switch transistor element is coupled in series with the primary pulldown transistor element in the current sinking path between the primary pulldown transistor element and the ground rail. Such a pulldown switch transistor element is used instead of the ground bounce blocking diode element. The pulldown switch transistor element is used in the MOS output buffer circuit having a bifurcated ground rail and primary and secondary pulldown transistor elements as set forth above. The pulldown switch transistor element is coupled between the primary pulldown transistor element and the relatively noisy output ground lead. The relatively small current carrying capacity secondary pulldown transistor element is again coupled between the output and the relatively quiet ground lead.

A control circuit is coupled to a control node of the pulldown switch transistor element for transient turn on of the pulldown switch transistor element when the output is still at a data signal logic high potential level during transition from high to low potential level at the output. To this end, the control circuit may include a logic NOR gate having a first input coupled to the buffer circuit input and a second input coupled to the buffer circuit output through an inverter gate. The control circuit operates the pulldown switch transistor element to provide the functional equivalent of the ground bounce blocking diode element. A delay circuit may also be coupled between the control nodes of the primary and secondary pulldown transistor elements.

For bipolar and BICMOS output buffer circuits, the invention provides a new bipolar NPN pulldown transistor structure having emitter, base, collector, and buried collector layer regions formed in a semiconductor substrate. The NPN transistor structure may be characterized by a parasitic diode coupling between the substrate and the buried collector layer and collector region. The bipolar transistor structure is incorporated in an output buffer circuit having a bifurcated ground rail including a relatively noisy output ground lead and a relatively quiet ground lead substantially isolated from each other. According to the invention the substrate is coupled to the quiet ground lead while the emitter region is coupled to the output ground lead thereby blocking transfer of ground bounce pulses in the output ground rail to the output through the parasitic diode coupling.

Other objects, features and advantages of the invention are apparent in the following specification and accompanying drawings.

BRIEF DESCRIPTION OF THE DRAWINGS

FIG. 4 is a block and schematic diagram of a ground bounce blocking output buffer circuit according to the invention, while

FIG. 5 is a block and schematic circuit diagram of another ground bounce blocking output buffer circuit with primary and secondary pulldown transistor elements, while

DESCRIPTION OF PREFERRED EXAMPLE EMBODIMENTS AND BEST MODE OF THE INVENTION

Figure 1:
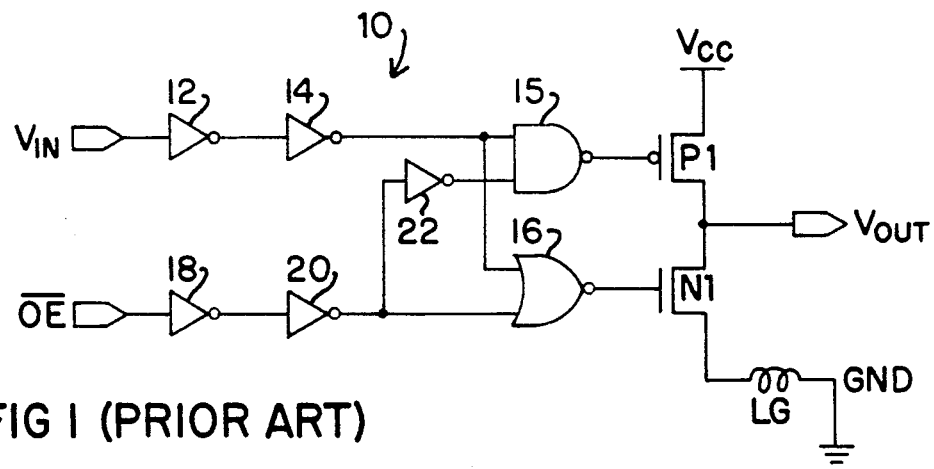
FIG. 1 is a schematic circuit diagram of a prior art CMOS output buffer circuit line driver.
Figure 3:
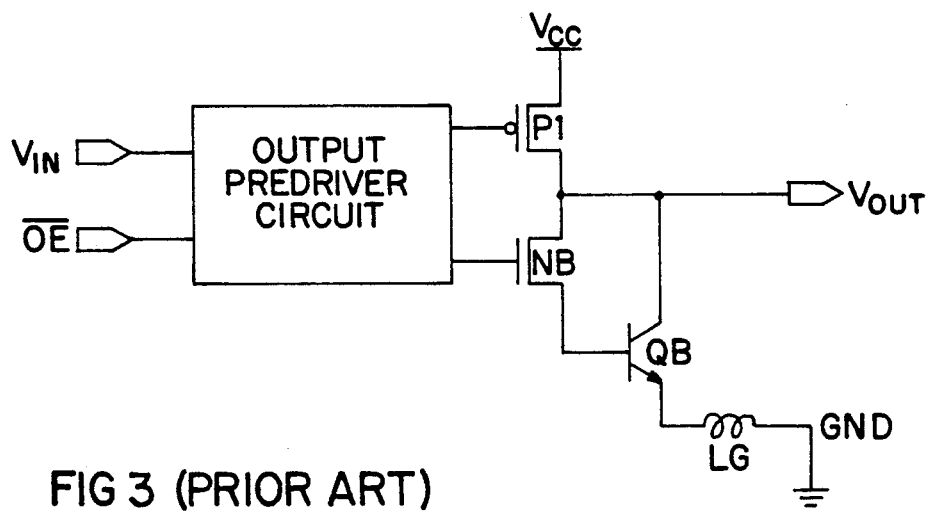
FIG. 3 is a block and schematic circuit diagram of a prior art BICMOS output buffer circuit.
Figure 4:
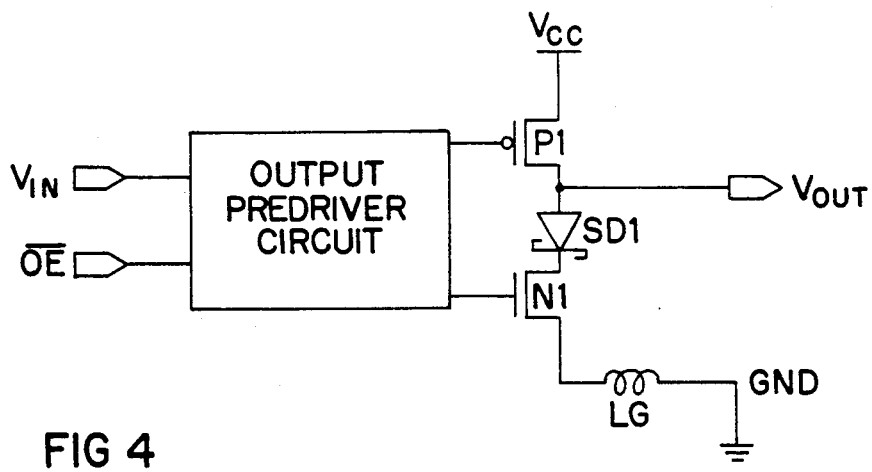

A ground bounce blocking MOS output buffer circuit according to the invention is illustrated in FIG. 4. Predriver circuitry for example as shown in FIG. 1 is indicated by the OUTPUT PREDRIVER CIRCUIT block. Other circuit components performing the same or similar circuit functions as set forth in the MOS circuits of FIGS. 1&3 are indicated by the same reference designations. A Schottky diode element SD1 is interposed in the current sinking path between the output $V_{OUT}$ and the primary pulldown transistor element N1. The diode element SD1 is oriented to pass the sinking current but to contain a ground rise in potential or ground bounce pulse developed by the rate of change of sinking current across the parasitic ground lead inductance LG of the ground rail GND. Diode element SD1 also blocks any other ground bounce noise originating in a shared ground rail. The containment diode SD1 generally prevents transfer of ground bounce noise spikes from the ground rail GND to the output $V_{OUT}$. Other quiet buffer circuit outputs tied to the bus are similarly protected from ground bounce pulses that might cause a false high signal.

Figure 4A:
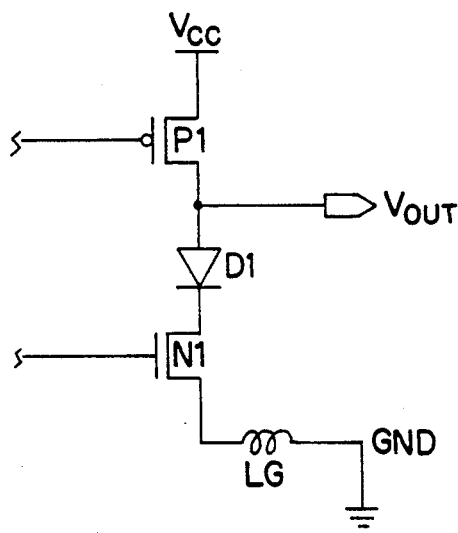
FIGS. 4A and 4B are fragmentary schematic circuit diagrams of alternative embodiments.

An alternative embodiment of the circuit is shown in FIG. 4A using a pn junction diode D1 for the containment blocking diode. In the circuit of FIG. 4A the pulldown transistor element N1 is able to pull down the potential at the output $V_{OUT}$ to a low potential level of only $1V_{BE}$ above ground 0 potential or approximately 0.6 v to 0.8 v. An advantage of the Schottky diode SD1 of FIG. 1 is that the Schottky diode may be constructed with a forward voltage drop as low as, for example, 0.2 v. The pulldown transistor element N1 can pull the potential at the output $V_{OUT}$ closer to the ground 0 potential for maintaining TTL bipolar specifications for the data signal logic low potential level within an adequate noise margin. Such a low forward threshold voltage drop Schottky diode may be constructed, for example, with metalization on a low doped N- silicon epitaxial layer using titanium-tungsten (Ti-W) or nickel (Ni) to form a Ti-W silicide or Ni silicide Schottky diode.

Figure 4B:
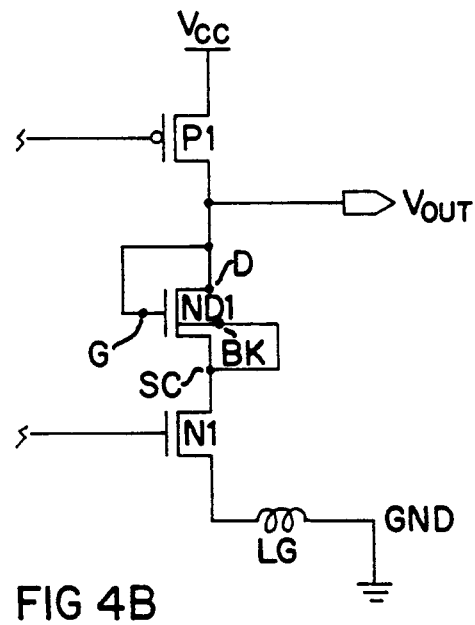

A further variation of the circuit of FIG. 4 is shown in FIG. 4B where the containment blocking diode element function is provided by an NMOS transistor element ND1 coupled in a diode coupling. To this end the gate node G is shorted to the drain node D. Furthermore the bulk node BK is coupled to the low potential level ground rail through source node SC. Alternatively the bulk may be connected directly to the ground rail or ground potential coupling of the substrate. The diode coupled NMOS transistor element ND1 may be constructed to minimize threshold voltage and channel resistance.

Figure 5A:
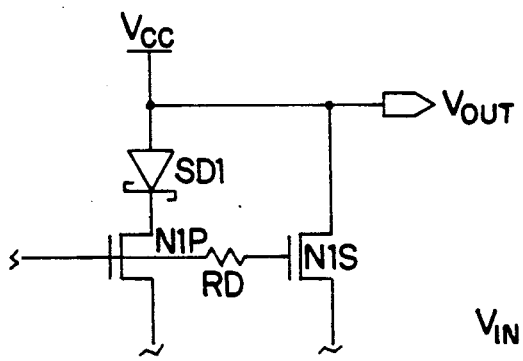
FIG. 5A is a fragmentary schematic circuit diagram of an alternative embodiment.
Figure 5:
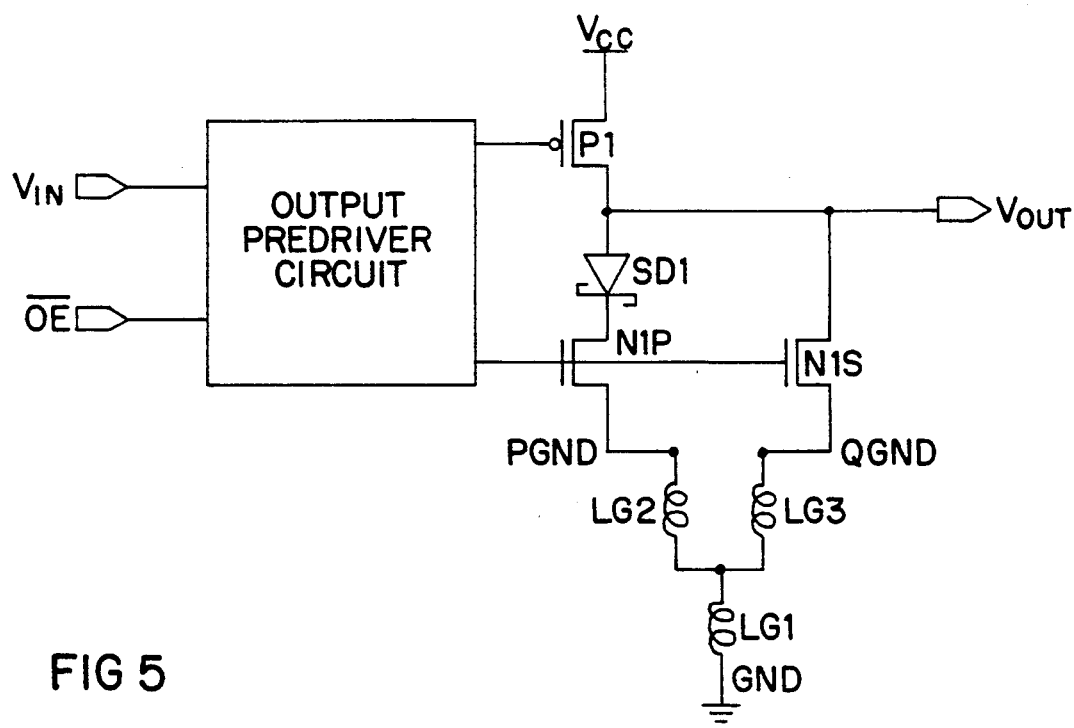

In the circuit of FIG. 5 the ground rail GND is bifurcated into a relatively noisy output ground lead PGND and a relatively quiet ground lead QGND. This may be accomplished by using a split lead frame, as described for example in the Alan C. Rogers U.S. patent application Ser. No. 327,348 filed Mar. 22, 1989 for ANTI-NOISE CIRCUITS. Such split lead frames split the major portion of the length of the ground rail into an output or power ground lead PGND and a quiet ground lead QGND with a common ground rail coupling GND to external ground. The major portion of the parasitic inductance is isolated in the separate output and quiet ground leads indicated by parasitic inductances LG2 and LG3. The common inductive coupling is only through the relatively small parasitic inductance LG1 of the common ground rail coupling GND. For example the parasitic inductance LG1 may be in order of magnitude smaller than the separate output and quiet ground lead parasitic inductances LG2,LG3. This separation of inductive coupling therefore isolates the noise pulses in the output ground PGND from the quiet ground QGND. Alternatively the bifurcated ground rail can be provided by entirely separate leads for the output ground lead and power ground lead.

In order to provide pulldown of the output $V_{OUT}$ to ground zero potential level in the steady state logic low condition at the output, a relatively small current carrying capacity secondary pulldown transistor element N1S is coupled in parallel with the primary pulldown transistor element N1P. The control gate nodes of the primary and secondary pulldown transistor elements N1P and N1S are coupled to each other. The drain and source nodes of the secondary pulldown transistor element N1S are coupled between the output $V_{OUT}$ and the relatively quiet ground lead QGND. The primary pulldown transistor element N1P is coupled to the relatively noisy output ground PGND. As a result the major portion of any ground bounce noise spikes are blocked from transfer to the output by the containment diode element SD1.

In the steady state logic low condition at the output $V_{OUT}$ of the circuit of FIG. 5, the secondary pulldown transistor element N1S is able to pull the output all the way to the ground zero potential. The small current carrying capacity of the secondary pulldown transistor element N1S effectively blocks return of noise spikes to the output $V_{OUT}$. By way of example, a primary pulldown transistor element N1P may have a channel width in the order of 1000μ while the secondary pulldown transistor element N1S may have a channel width of only for example 6μ.

In a variation of the ground bounce blocking output buffer circuit of FIG. 5, turn on of the secondary pulldown transistor element N1S is delayed. As shown in FIG. 5A a delay circuit in the form of delay resistor element RD is coupled between the control gate nodes of the primary and secondary pulldown transistor elements N1P, N1S. Turn on of the secondary pulldown transistor element N1S is therefore delayed until after turn on of the primary pulldown transistor element N1P following initial discharge of sinking current from the output. The secondary pulldown transistor element N1S completes pulldown of the potential at the output $V_{OUT}$ to the ground 0 potential level during the steady state logic low level at the output.

Figure 6A:
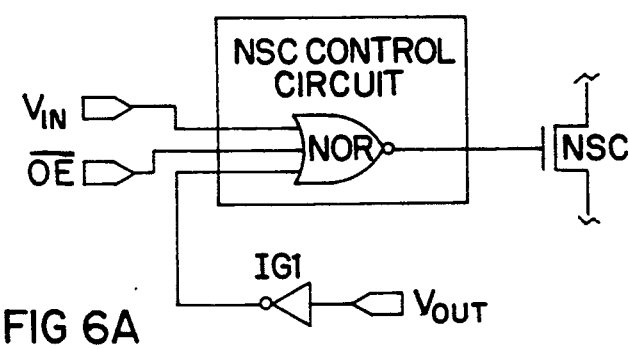
FIG. 6A is a detailed fragmentary circuit diagram of the switch control transistor element control circuit.
Figure 6:
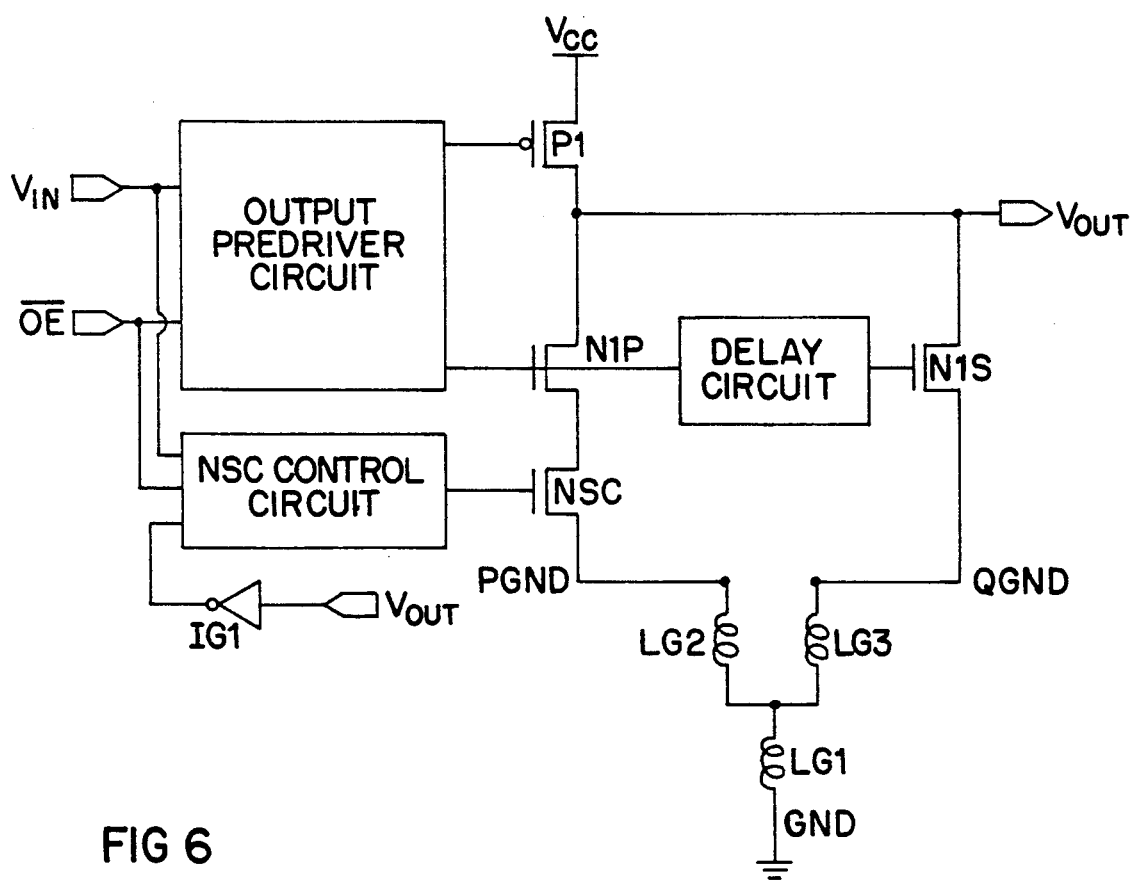
FIG. 6 is a block and schematic circuit diagram of another ground bounce blocking output buffer circuit with a switch control transistor element for blocking ground bounce pulses.

In the circuits of FIGS. 5A,6 & 6A, the primary pulldown transistor element N1P effectively determines the dynamic output characteristics at the buffer circuit output $V_{OUT}$ during transition. The secondary pulldown transistor element N1S effectively determines the steady-state or static output characteristics at the output. The channel resistance/channel width values may be selected according to the desired dynamic and static conditions to be achieved at the output. With the added delay element, the secondary pulldown transistor element N1S need no longer be an order of magnitude smaller than the primary pulldown transistor element N1P, and in fact may be the same size or same order of magnitude as N1P.

Another embodiment of the ground bounce containment MOS output buffer circuit is illustrated in FIG. 6. According to this circuit embodiment, ground bounce pulses in the relatively noisy output ground rail PGND are blocked from the output $V_{OUT}$ by an active switching circuit provided by NMOS switch transistor element NSC and the NSC control circuit. The ground bounce blocking NMOS switch transistor element NSC is coupled between the primary pulldown transistor element N1P and the output power ground lead PGND. The control gate node is coupled to an NSC control circuit for controlling the conducting state of NSC according to the data signals at the input $V_{IN}$ and the output $V_{OUT}$.

In the NSC control circuit example of FIG. 6A, three inputs are coupled to a NOR gate, the data signal input $V_{IN}$, the tristate output enable signal input OE, and the output $V_{OUT}$ through inverter gate IG1. The NOR gate output is coupled to the control gate node of the switch transistor element NSC. By this logic circuit arrangement, the switch transistor element NSC turns on for a transient duration first phase (Phase 1, TABLE I) when the output $V_{OUT}$ is still at a logic high potential level during transition from logic high to low potential level at the output. The switch transistor element NSC then turns off in a second phase (Phase II, TABLE I) following initial discharge of sinking current from the output to block transfer of ground bounce pulses from the output ground lead PGND to the output $V_{OUT}$. The delay circuit may be, for example a delay resistor element providing an RC time constant. The delay is selected for turn on of the secondary pulldown transistor element N1S following the initial discharge of sinking current from the output for final pulldown of the output $V_{OUT}$ to ground 0 potential.

The logic function of the NSC Control Circuit of FIGS. 6 and 6A is summarized in TABLE I. In the example of the circuit of FIG. 5, the channel width and therefore current carrying capacity of the secondary pulldown transistor element N1S is, for example, an order of magnitude smaller than the channel width and current carrying capacity of the primary pulldown transistor element N1P. In the circuits of FIGS. 5A, 6 & 6A, this limitation does not apply and the values of primary and secondary pulldown transistor elements N1P, N1S are selected to achieve the specified dynamic and static characteristics at the output $V_{OUT}$. Example values may be, however, the same as the circuit of FIG. 5.

TABLE I

| Phase | $V_{IN}$ | $V_{OUT}$ | N1P | NSC | N1S |
|---|---|---|---|---|---|
| Steady State Hi | Hi | Hi | Off | On/Off | Off |
| Hi/Lo Transition Phase 1 | Lo | Hi | On | On | Off |
| Hi/Lo Transition Phase 2 | Lo | Lo | On | Off | On |

Figure 2:
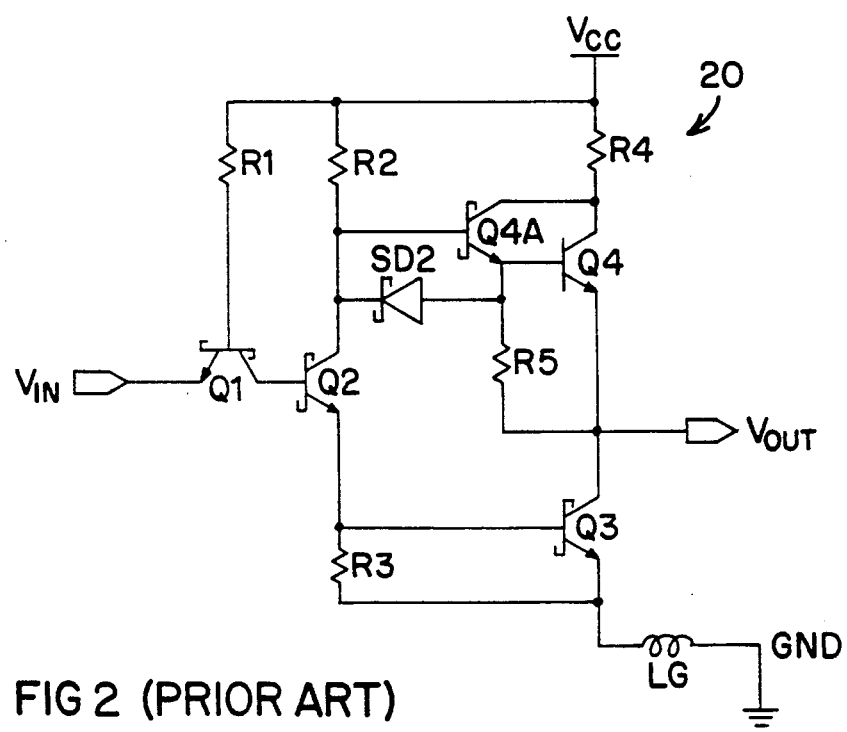
FIG. 2 is a schematic circuit diagram of a prior art bipolar TTL output buffer circuit.
Figure 7:
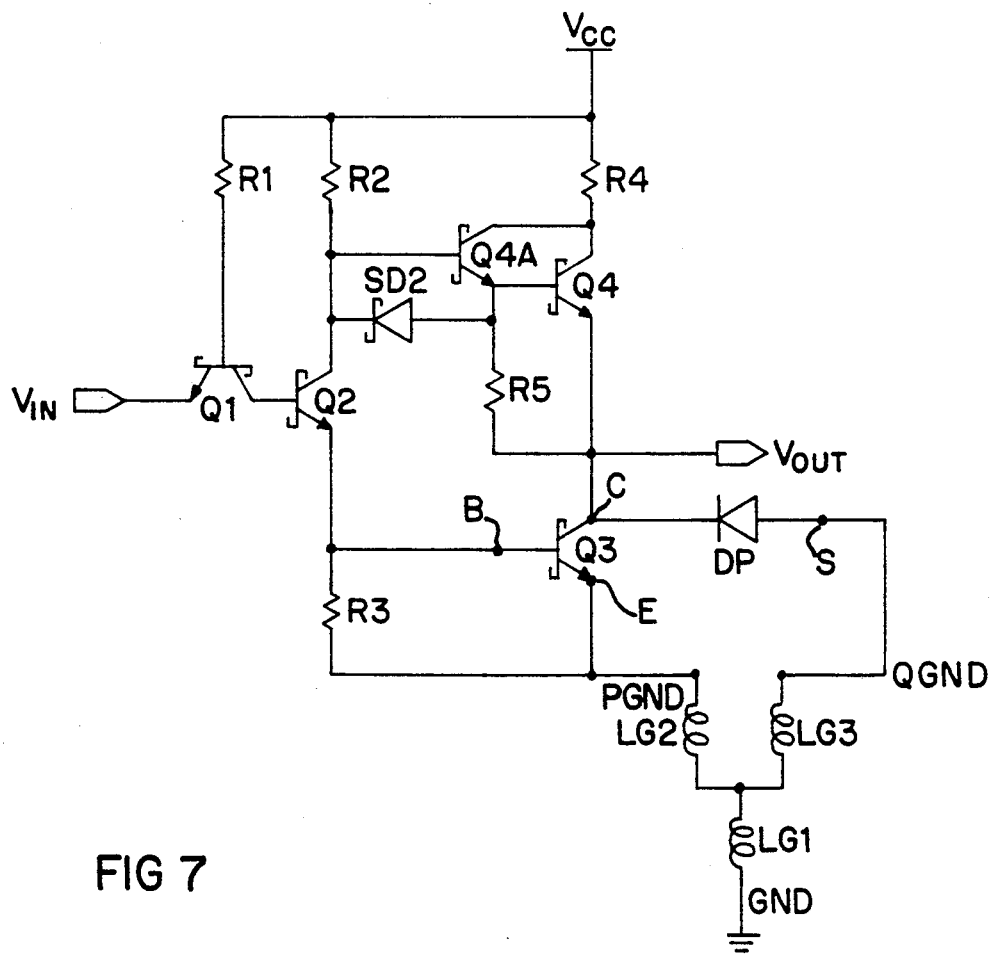
FIG. 7 is a schematic circuit diagram of a ground bounce blocking bipolar output buffer circuit.

A ground bounce blocking bipolar TTL output buffer circuit according to the invention is illustrated in FIG. 7. Circuit components performing the same or similar functions as the circuit of FIG. 2 are indicated by the same reference designations. In the circuit of FIG. 7, the ground rail GND is bifurcated into relatively inductively isolated output ground lead PGND and quiet ground lead QGND. In the circuit of FIG. 7 the problematic pathway for transfer of ground bounce pulses in the relatively noisy output ground lead PGND to the output $V_{OUT}$ through the parasitic diode coupling is substantially eliminated. This parasitic diode coupling path is from the substrate S to the collector region C through the buried collector layer BCL and the collector sink region CSK.

The substrate node S of bipolar pulldown transistor element Q3 is coupled to the relatively quiet ground lead QGND which is relatively inductively isolated from the noisy output ground lead PGND. The emitter region node E of pulldown transistor element Q3 is coupled to the relatively noisy output ground lead PGND. By this isolation, ground bounce noise spikes developing in the parasitic lead inductance LG2 of the output ground lead PGND are substantially thwarted from passage or transfer to the output $V_{OUT}$ through the substrate to collector region path. While base drive current at base node B may still be diverted to the collector node C and the output $V_{OUT}$ during ground bounce events, the primary noise problem created by transfer of ground bounce noise spikes is substantially eliminated.

Figure 8:
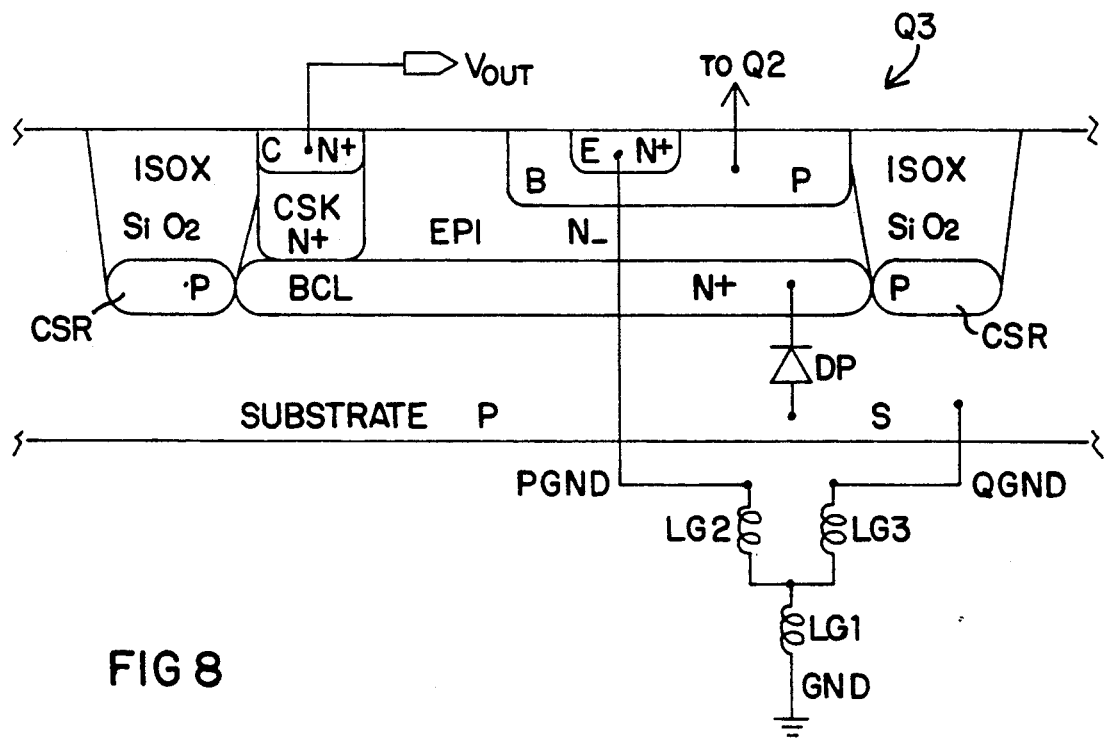
FIG. 8 is a diagrammatic side view of a bipolar NPN pulldown transistor structure for blocking transfer of ground bounce signals from the output ground lead to a buffer circuit output.

The integrated circuit structure for the NPN pulldown transistor element Q3 according to the invention is illustrated in FIG. 8. The component regions of the NPN bipolar transistor element are shown within the isolation oxide regions ISOX of silicon dioxide $SiO_2$ and channel stop region CSR doped with P type atoms. These NPN regions include the collector region C, collector sink region CSK, buried collector layer BCL, epitaxial layer EPI, base region B, and emitter region E. Other component elements performing the same or similar functions as shown in FIG. 7 are indicated by the same reference designations.

For BICMOS circuit applications, the NPN pulldown transistor element Q3 of FIG. 7 having the NPN transistor structure of FIG. 8 may be substituted for the pulldown transistor element QB of FIG. 3. Similarly, the ground bounce blocking or containment diode element SD1 of FIG. 4 may be inserted between the output $V_{OUT}$ and NMOS pulldown transistor element NB of FIG. 3.

Generally, the ground bounce blocking diodes in the foregoing circuits can be constructed with smaller than conventional dimensions, for example smaller channel length, for better conductance and lower threshold voltage. The output buffer circuits can tolerate the higher leakage and reduced break down voltage at the ground bounce blocking/containment diode element without substantially affecting circuit performance.

The ground bounce blocking and containment circuits described above may be combined with any of a variety of anti-ground bounce circuits intended initially to prevent or reduce development of the ground bounce spikes during switching events. For example the ground bounce blocking circuits may be used in combination with the Jeffrey B. Davis output buffer circuit for reducing switching induced noise using bifurcated turn on output transistor elements described in U.S. Pat. No. 4,961,010; the Jeffrey B. Davis output buffer circuit for reducing switching induced noise using output voltage sensing described in U.S. patent application Ser. No. 483,931 filed Feb. 22, 1990; the Jeffrey B. Davis output buffer circuit for reducing switching induced noise using signal feed forward described in U.S. patent application Ser. No. 483,927, filed Feb. 22, 1990; the Alan C. Rogers anti-noise circuits which suppress the peak amplitude of ground bounce noise spikes by suppressing turn on of output transistors described in U.S. patent application Ser. No. 327,348, filed Mar. 22, 1989; etc. The specifications and teachings of these patent disclosures are incorporated herein by reference for use in combination with the ground bounce blocking and containment circuits according to the present invention.

While the invention is described with reference to particular example embodiments it is intended to cover all modifications and equivalents within the scope of the following claims.

I claim:

1. An output buffer circuit having an input ($V_{IN}$) for receiving data signals of logic high and low potential levels, an output ($V_{OUT}$) for delivering data signals propagated through the buffer circuit, a relatively large current carrying capacity primary pulldown transistor element (N1,N1P) coupled to the output for discharging a relatively large sinking current from the output ($V_{OUT}$) through a sinking current path to a low potential power ground rail (GND,PGND) including parasitic ground rail lead inductance (LG,LG1,LG2), and pullup means (P1) coupled to the output for sourcing current to the output ($V_{OUT}$) from a high potential power supply rail ($V_{CC}$), said output buffer circuit being subject to ground bounce pulses in the ground rail (GND,PGND), comprising:

diode means (SD1,D1,ND1,NSC) coupled in the sinking current path in series with the primary pulldown transistor element (N1,N1P) between the buffer circuit output ($V_{OUT}$) and the low potential power ground rail (GND,PGND), said diode means being oriented for passing sinking current to the low potential ground rail (GND,PGND) and for blocking transfer to ground bounce pulses in the ground rail (GND, PGND) to the output ($V_{OUT}$) thereby protecting quiet outputs of similar buffer circuits coupled to the same ground rail;

said power ground rail (GND) of the output buffer circuit comprising a relatively noisy output ground lead (PGND) and a relatively quiet ground lead (QGND) relatively inductively isolated from each other, said primary pulldown transistor element (N1P) being coupled to the relatively noisy output ground lead (PGND) and further comprising a secondary pulldown transistor element (N1S), said primary and secondary pulldown transistor element having control nodes coupled to each other, said secondary pulldown transistor element (N1S) being coupled between the output ($V_{OUT}$) and the relatively quiet ground lead (QGND) for discharging a secondary sinking current for pulling down the potential at the output $V_{OUT}$ substantially to ground potential.

2. The output buffer circuit of claim 1 wherein the diode means comprises a Schottky diode (SD1).

3. The output buffer circuit of claim 2 wherein the Schottky diode (SD1) is constructuted with a relatively low forward threshold potential.

4. The output buffer circuit of claim 1 wherein the diode means comprises a gate to drain shorted, diode coupled, NMOS transistor element (ND1).

5. The output buffer circuit of claim 1 wherein the diode means comprises a pn junction diode (D1).

6. The output buffer circuit of claim 1 wherein the primary and secondary pulldown transistor elements (N1P,N1S) comprise NMOS transistor elements having control gate nodes coupled to each other, source nodes coupled respectively to the relatively noisy output ground lead (PGND) and relatively quiet ground lead (QGND), the drain node of the primary pulldown transistor element being coupled to the diode means (SD1,D1,ND1), the drain node of the secondary pulldown transistor element being coupled to the output ($V_{OUT}$), said primary pulldown transistor element N1P having a relatively large current carrying capacity and said secondary pulldown transistor element N1S having a relatively small current carrying capacity.

7. The output buffer circuit of claim 1 further comprising a delay circuit (RD) coupled between the control nodes of the primary and secondary pulldown transistor elements (N1P,N1S) to delay turn on of the secondary pulldown transistor element (N1S).

8. The output buffer circuit of claim 7 wherein the delay circuit comprises a delay resistor element (RD) coupled between said control nodes of the primary and secondary pulldown transistor elements (N1P,N1S).

9. An output buffer circuit having an input ($V_{IN}$) for receiving data signals of logic high and low potential levels, an output ($V_{OUT}$) for delivering data signals propagated through the buffer circuit, a relatively large current carrying capacity primary pulldown transistor element (N1,N1P) coupled to the output for discharging a relatively large sinking current from the output ($V_{OUT}$) through a sinking current path to a low potential power ground rail (GND,PGND) including parasitic ground rail lead inductance (LG,LG1,LG2), and pullup means (P1) coupled to the output for sourcing current to the output ($V_{OUT}$) from a high potential power supply rail ($V_{CC}$), said output buffer circuit being subject to ground bounce pulses in the ground rail (GND,PGND), comprising:

a pulldown switch transistor element (NSC) coupled in series with the primary pulldown transistor element (N1P) between the primary pulldown transistor element and the low potential power ground rail (GND);

said low potential power ground rail (GND) comprising a relatively noisy output ground lead (PGND) and a relatively quiet ground lead (QGND);

said pulldown switch transistor element (NSC) being coupled to the output ground lead (PGND);

and a secondary pulldown transistor element (N1S), said primary and secondary pulldown transistor elements (N1P,N1S) having control nodes coupled to each other, said secondary pulldown transistor element (N1S) being coupled between the output ($V_{OUT}$) and quiet ground lead (QGND) for discharging a secondary sinking current from the output ($V_{OUT}$) for pulling down the potential at the output substantially to ground potential;

and an NSC control circuit coupled to a control node of the pulldown switch transistor element (NSC) for transient turn on of the pulldown switch transistor element (NSC) when the output ($V_{OUT}$) is still at a data signal logic high potential level and during transition from high to low potential level at the output ($V_{OUT}$).

10. The output buffer circuit of claim 9 wherein a delay circuit is coupled between the control nodes of the primary and secondary pulldown transistor elements (N1P,N1S) to delay turn on of the secondary pulldown transistor element (N1S).

11. The output buffer circuit of claim 10 wherein the delay circuit comprises a delay resistor element (RD) coupled between the control nodes of the primary and secondary pulldown transistor elements (N1P,N1S).

12. The output buffer circuit of claim 9 wherein the NSC control circuit comprises a logic NOR gate having a first input coupled to the buffer circuit input ($V_{IN}$), and a second input coupled to the buffer circuit output ($V_{OUT}$) through an inverter gate (IG1).

13. The output buffer circuit of claim 9 wherein the primary and secondary pulldown transistor elements (N1P,N1S) and the pulldown switch transistor element (NSC) comprise NMOS transistor elements, said pulldown switch transistor element (NSC) having a drain node coupled to a source node of the primary pulldown transistor element (N1P) and a source node coupled to the output ground lead (PGND), said secondary pulldown transistor element (N1S) having a drain node coupled to the output ($V_{OUT}$) and a source node coupled to the quiet ground lead (QGND).

14. The output buffer circuit of claim 9 wherein the relatively noisy output ground lead (PGND) and the relatively quiet ground lead (QGND) comprise split leads of a split lead frame.

* * * * *